United States Patent
Imamura

(10) Patent No.: US 9,882,544 B2
(45) Date of Patent: Jan. 30, 2018

(54) ELECTRONIC COMPONENT

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 15/005,213

(22) Filed: Jan. 25, 2016

(65) Prior Publication Data

US 2016/0218690 A1    Jul. 28, 2016

(30) Foreign Application Priority Data

Jan. 26, 2015   (JP) .................................. 2015-012727

(51) Int. Cl.
| | | |
|---|---|---|
| *H03H 7/01* | (2006.01) | |
| *H01P 1/203* | (2006.01) | |
| *H03H 1/00* | (2006.01) | |

(52) U.S. Cl.
CPC ........ *H03H 7/1708* (2013.01); *H03H 7/0115* (2013.01); *H03H 7/1775* (2013.01); *H01P 1/20345* (2013.01); *H03H 2001/0085* (2013.01)

(58) Field of Classification Search
CPC ......... H03H 2001/0085; H03H 7/0115; H03H 7/09; H03H 7/1775; H03H 7/1708
USPC .................................................. 333/175, 185
See application file for complete search history.

(56) References Cited

U.S. PATENT DOCUMENTS

| 3,718,874 A * | 2/1973 | Cooper, Jr. .......... H03H 7/0161 333/204 |
|---|---|---|
| 6,411,178 B1 | 6/2002 | Matsumura et al. |
| 2007/0241839 A1* | 10/2007 | Taniguchi ................ H03H 7/09 333/185 |
| 2009/0121813 A1* | 5/2009 | Tomaki ............... H01P 1/20327 333/219.1 |
| 2010/0039189 A1 | 2/2010 | Taniguchi |
| 2011/0074526 A1 | 3/2011 | Taniguchi |
| 2013/0229241 A1 | 9/2013 | Imamura |

(Continued)

FOREIGN PATENT DOCUMENTS

| EP | 2 009 787 A1 | 12/2008 |
|---|---|---|
| JP | 08-97603 A | 4/1996 |
| JP | 11-186807 A | 7/1999 |

(Continued)

OTHER PUBLICATIONS

Official Communication issued in corresponding Taiwanese Patent Application No. 105100901, dated Nov. 22, 2016.

(Continued)

*Primary Examiner* — Rakesh Patel
(74) *Attorney, Agent, or Firm* — Keating & Bennett, LLP

(57) ABSTRACT

An electronic component includes first through sixth LC parallel resonators and seventh through ninth capacitors. The first through sixth LC parallel resonators are arranged in this order in a first direction perpendicular or substantially perpendicular to a stacking direction of a multilayer body of the electronic component, and define a band pass filter. The seventh capacitor is connected between the first and sixth LC parallel resonators. The eighth capacitor is connected between the first and third LC parallel resonators. The ninth capacitor is connected between the fourth and sixth LC parallel resonators.

16 Claims, 21 Drawing Sheets

(56) References Cited

U.S. PATENT DOCUMENTS

2014/0145798 A1* 5/2014 Masuda ................. H03H 7/09
333/185

FOREIGN PATENT DOCUMENTS

| | | |
|---|---|---|
| JP | 2001-136045 A | 5/2001 |
| TW | 200701544 A | 1/2007 |
| WO | 2007/119356 A1 | 10/2007 |
| WO | 2008/143071 A1 | 11/2008 |
| WO | 2012/077498 A1 | 6/2012 |

OTHER PUBLICATIONS

Official Communication issued in Japanese Patent Application No. 2015-012727, dated Jul. 18, 2017.

* cited by examiner

ELECTRONIC COMPONENT

BACKGROUND OF THE INVENTION

1. Field of the Invention

The present invention relates to an electronic component, and more particularly, to an electronic component including a plurality of LC parallel resonators.

2. Description of the Related Art

As electronic components of the related art, a multilayer band pass filter disclosed in International Publication No. 2007/119356, for example, is known. This multilayer band pass filter includes five stages of LC parallel resonators. By forming LC parallel resonators in multiple stages, it is possible to increase the attenuation of signals in the bands outside of a pass band.

In a multilayer band pass filter, it is desirable to increase the attenuation of signals in the bands outside of a pass band.

SUMMARY OF THE INVENTION

Accordingly, preferred embodiments of the present invention provide an electronic component in which the attenuation of radio-frequency signals in the bands outside of a pass band are increased.

According to a preferred embodiment of the present invention, an electronic component includes a multilayer body, first through sixth LC parallel resonators, and seventh through ninth capacitors. The multilayer body includes a plurality of insulating layers stacked on each other in a stacking direction. The first through sixth LC parallel resonators are arranged in a first direction perpendicular or substantially perpendicular to the stacking direction in order of the first through sixth LC parallel resonators and define a band pass filter. The seventh capacitor is connected between the first and sixth LC parallel resonators. The eighth capacitor is connected between the first and third LC parallel resonators. The ninth capacitor is connected between the fourth and sixth LC parallel resonators. The n-th (n is an integer of 1 to 6) LC parallel resonator includes an n-th inductor and an n-th capacitor. An n-th loop plane which is surrounded by the n-th inductor and the n-th capacitor and which is parallel or substantially parallel with the stacking direction is formed. Among the first through sixth loop planes, loop planes adjacent to each other in the first direction are superposed on each other, as viewed from the first direction.

According to preferred embodiments of the present invention, it is possible to increase the attenuation of radio-frequency signals in the bands outside of a pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

An electronic component $10a$ according to a first preferred embodiment of the present invention will be described below with reference to the accompanying drawings.

Figure 1:
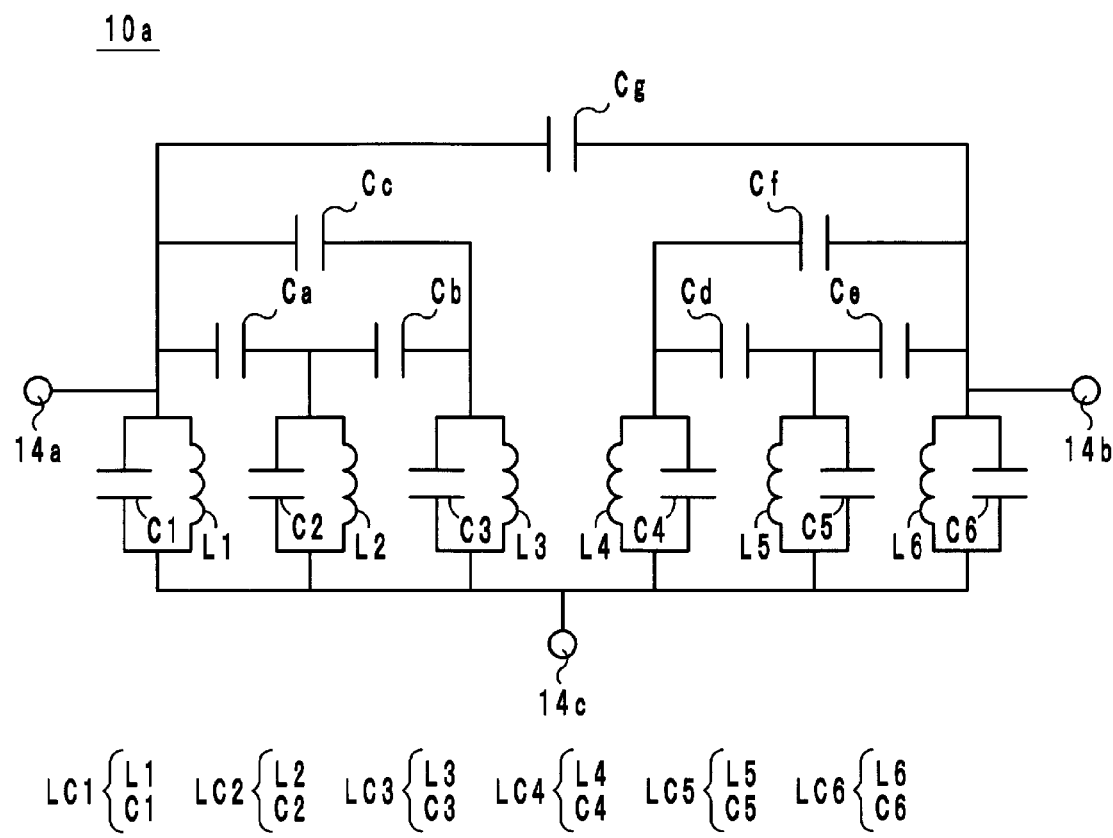
FIG. 1 is an equivalent circuit diagram of an electronic component according to a first preferred embodiment of the present invention.

An example of the equivalent circuit of the electronic component $10a$ will first be discussed below with reference to the equivalent circuit diagram of FIG. 1. As shown in FIG. 1, the electronic component $10a$ includes inductors L1 through L6, capacitors C1 through C6 and Ca through Cg, and outer electrodes $14a$ through $14c$ as the configuration of the equivalent circuit. The electronic component $10a$ is a band pass filter which allows radio-frequency signals in a predetermined band to pass therethrough.

The outer electrodes $14a$ and $14b$ are input/output terminals into and from which a radio-frequency signal is input and output. The outer electrode $14c$ is a ground terminal to be grounded.

The inductors L1 through L6 and the capacitors C1 through C6 are respectively connected in parallel with each other so as to respectively define LC parallel resonators LC1 through LC6.

A first end of the LC parallel resonator LC1 is connected to the outer electrode $14a$, while a first end of the LC parallel resonator LC6 is connected to the outer electrode $14b$. The LC parallel resonators LC1 through LC6 are arranged in a direction from the outer electrode $14a$ to the outer electrode $14b$ in this order. Among the LC parallel resonators LC1 through LC6, adjacent LC parallel resonators are magnetically coupled with each other, so that the LC parallel resonators LC1 through LC6 define a band pass filter. Second ends of the LC parallel resonators LC1 through LC6 are connected to the outer electrode $14c$. The first ends of the LC parallel resonators LC1 through LC6 are upper nodes between the inductors and the capacitors of the LC parallel resonators LC1 through LC6 in FIG. 1. The second ends of the LC parallel resonators LC1 through LC6 are lower nodes between the inductors and the capacitors of the LC parallel resonators LC1 through LC6 in FIG. 1.

The capacitor Ca is connected between the first end of the LC parallel resonator LC1 and that of the LC parallel resonator LC2. The capacitor Cb is connected between the first end of the LC parallel resonator LC2 and that of the LC parallel resonator LC3. The capacitor Cc is connected between the first end of the LC parallel resonator LC1 and that of the LC parallel resonator LC3.

The capacitor Cd is connected between the first end of the LC parallel resonator LC4 and that of the LC parallel resonator LC5. The capacitor Ce is connected between the first end of the LC parallel resonator LC5 and that of the LC parallel resonator LC6. The capacitor Cf is connected between the first end of the LC parallel resonator LC4 and that of the LC parallel resonator LC6.

The capacitor Cg is connected between the outer electrodes 14a and 14b so as to be connected between the first end of the LC parallel resonator LC1 and that of the LC parallel resonator LC6.

The electronic component 10a having the structure described above defines a band pass filter that allows radio-frequency signals having a frequency near the resonant frequency of the LC parallel resonators LC1 through LC6 (hereinafter simply referred to as the "resonant frequency") to transmit from the outer electrode 14a to the outer electrode 14b. This will be discussed more specifically. The impedance value of the LC parallel resonators LC1 through LC6 is maximized when a radio-frequency signal having a frequency near the resonant frequency is input from the outer electrode 14a. Accordingly, this radio-frequency signal is unable to pass through the LC parallel resonators LC1 through LC6, and thus, it is not output from the outer electrode 14c. As a result, this radio-frequency signal is output from the outer electrode 14b. On the other hand, a radio-frequency signal having a frequency other than the frequencies near the resonant frequency passes through the LC parallel resonators LC1 through LC6 and is output from the outer electrode 14c.

Figure 2:
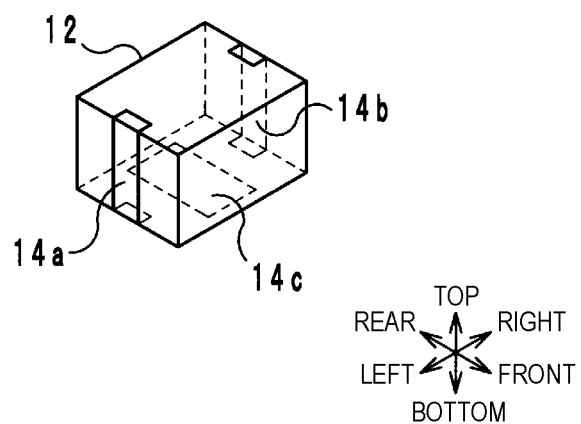
FIG. 2 is an external perspective view of electronic components according to first through third preferred embodiments of the present invention.
Figure 3A:
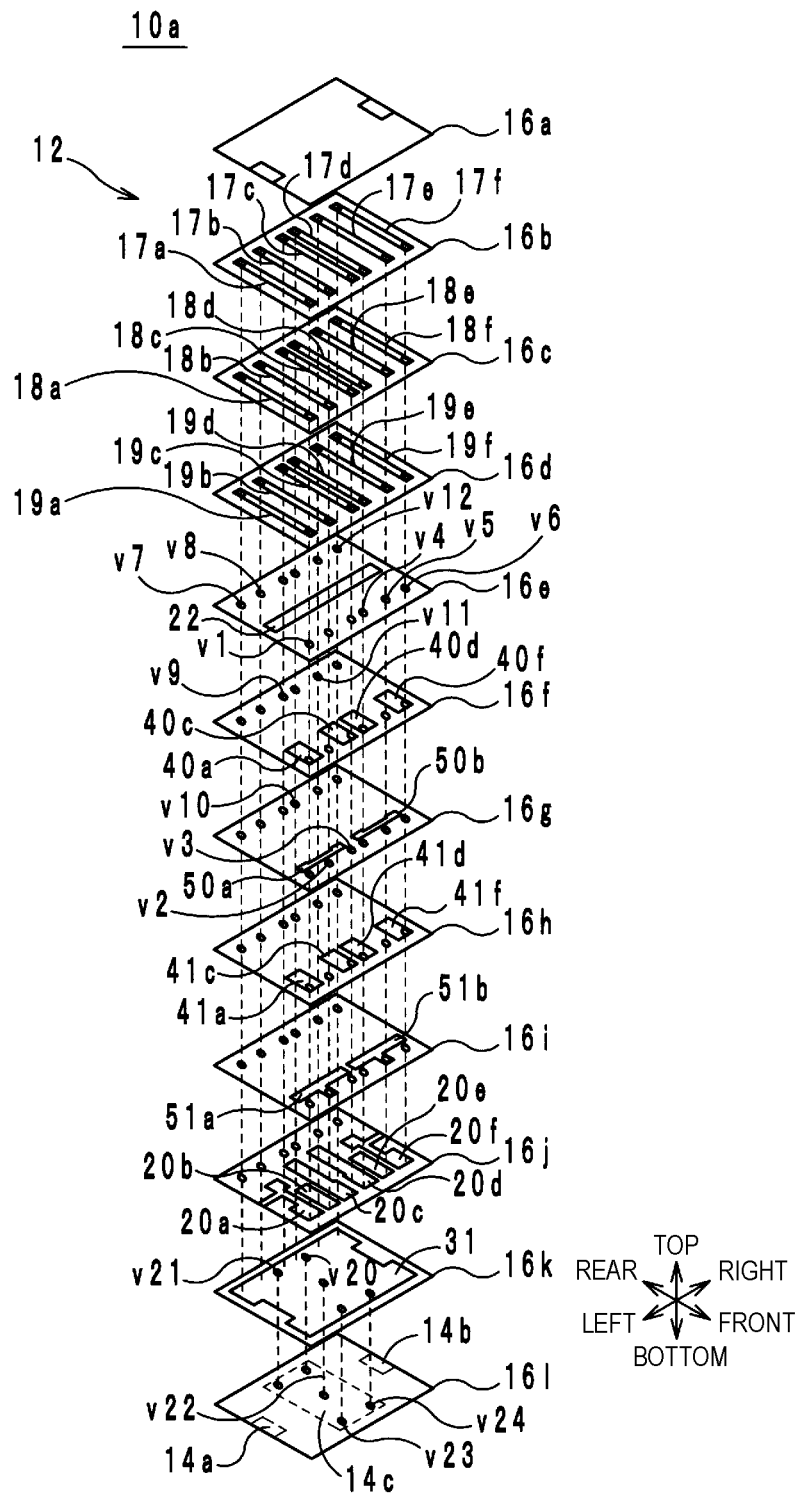
FIG. 3A is an exploded perspective view of the electronic component according to the first preferred embodiment of the present invention.
Figure 3B:
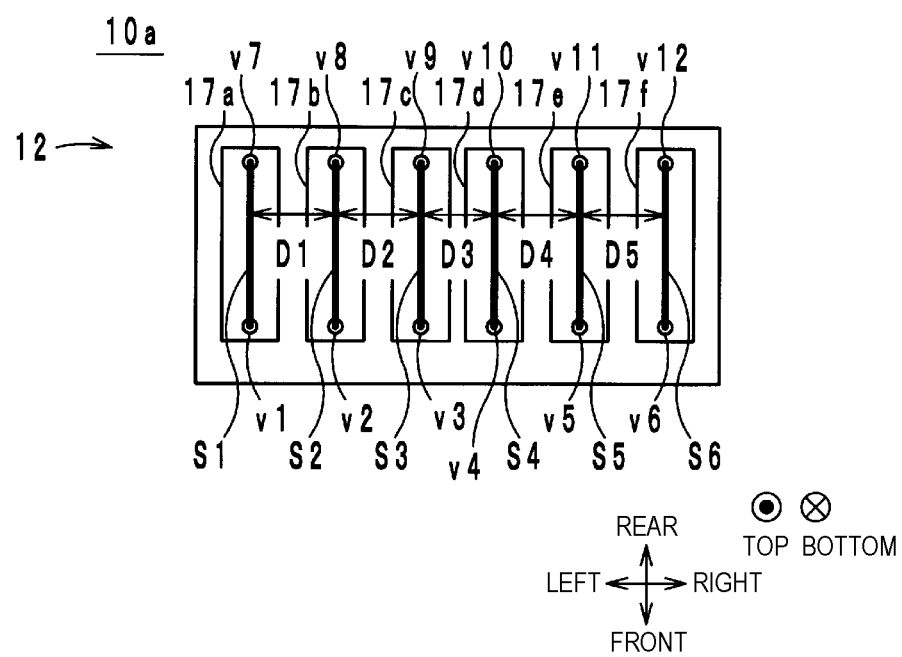
FIG. 3B is a top view of the electronic component according to the first preferred embodiment of the present invention seen through from above.

An example of the specific configuration of the electronic component 10a will now be described below with reference to the drawings. FIG. 2 is an external perspective view of the electronic component 10a. FIG. 3A is an exploded perspective view of the electronic component 10a. FIG. 3B is a top view of the electronic component 10a seen through from above. In FIG. 3B, a multilayer body 12, inductor conductive layers 17a through 17f, and via-hole conductors v1 through v12 are only shown.

Hereinafter, the stacking direction of the multilayer body 12 of the electronic component 10a will be defined as a top-bottom direction, the longitudinal direction of the electronic component 10a, as viewed from above, will be defined as a right-left direction, and the widthwise direction of the electronic component 10a, as viewed from above, will be defined as a front-rear direction. The top-bottom direction, the front-rear direction, and the right-left direction are perpendicular or substantially perpendicular to each other.

The electronic component 10a includes a multilayer body 12, outer electrodes 14a through 14c, inductor conductive layers 17a through 17f, 18a through 18f, and 19a through 19f, capacitor conductive layers 20a through 20f, 22, 40a, 40c, 40d, 40f, 41a, 41c, 41d, 41f, 50a, 50b, 51a, and 51b, a ground conductive layer 31, and via-hole conductors v1 through v12 and v20 through v24 (an example of an interlayer connecting conductor).

The multilayer body 12 preferably has a rectangular or substantially rectangular parallelepiped shape, and includes insulating layers 16a through 16l stacked on each other in this order from the top side to the bottom side. The insulating layers 16a through 16l preferably have a rectangular or substantially rectangular shape, as viewed from above, and are made of an insulating material, such as ceramic. Hereinafter, the upper main surfaces of the insulating layers 16a through 16l will be referred to as "top surfaces", and the lower main surfaces thereof will be referred to as "bottom surfaces".

The outer electrodes 14a and 14b are respectively disposed on the left and right surfaces of the multilayer body 12 and extend in the top-bottom direction. The top and bottom end portions of the outer electrodes 14a and 14b are bent to the top and bottom surfaces of the multilayer body 12. The outer electrode 14c is a rectangular or substantially rectangular conductive layer disposed on the bottom surface of the multilayer body 12. The outer electrodes 14a through 14c are preferably formed by Ni- and Sn-plating on base electrodes made of, for example, silver.

The inductor conductive layers 17a through 17f, 18a through 18f, and 19a through 19f preferably are strip-shaped conductive layers disposed on the top surfaces of the insulating layers 16b, 16c, and 16d, respectively, and extend in the front-rear direction.

The via-hole conductor v1 passes through the insulating layers 16b through 16i in the top-bottom direction. The top end of the via-hole conductor v1 is connected to the front ends of the inductor conductive layers 17a, 18a, and 19a. With this configuration, the via-hole conductor v1 extends from the inductor conductive layers 17a, 18a, and 19a downward. The via-hole conductor v7 passes through the insulating layers 16b through 16j in the top-bottom direction. The via-hole conductor v7 is located farther rearward than the via-hole conductor v1. Accordingly, the top end of the via-hole conductor v7 is connected to the rear ends of the inductor conductive layers 17a, 18a, and 19a. With this configuration, the via-hole conductor v7 extends from the inductor conductive layers 17a, 18a, and 19a downward.

The inductor conductive layers 17a, 18a, and 19a and the via-hole conductors v1 and v7 having the structure described above are included in the inductor L1. The inductor L1 preferably has an angular U-shape opened downward, as viewed from the left side.

The capacitor conductive layer 20a preferably is a strip-shaped conductive layer disposed on the top surface of the insulating layer 16j and extending in the front-rear direction.

The ground conductive layer 31 is a rectangular or substantially rectangular conductive layer disposed on the top surface of the insulating layer 16k and covers substantially the entire surface of the insulating layer 16k. With this configuration, the capacitor conductive layer 20a opposes the ground conductive layer 31 with the insulating layer 16k interposed therebetween.

The capacitor conductive layer 20a and the ground conductive layer 31 having the structure described above are included in the capacitor C1. The bottom end of the via-hole conductor v1 is connected to the capacitor conductive layer 20a, while the bottom end of the via-hole conductor v7 is connected to the ground conductive layer 31. With this configuration, the inductor L1 and the capacitor C1 are connected in parallel with each other so as to define the LC parallel resonator LC1. The inductor L1 turns around counterclockwise in a direction from the capacitor conductive layer 20a to the ground conductive layer 31, as viewed from the left side.

The inductor conductive layers 17b, 18b, and 19b and the via-hole conductors v2 and v8 are included in the inductor L2. The capacitor conductive layer 20b and the ground conductive layer 31 are included in the capacitor C2. The inductor L2 and the capacitor C2 are connected in parallel with each other so as to define the LC parallel resonator LC2.

The inductor conductive layers 17c, 18c, and 19c and the via-hole conductors v3 and v9 are included in the inductor L3. The capacitor conductive layer 20c and the ground conductive layer 31 are included in the capacitor C3. The inductor L3 and the capacitor C3 are connected in parallel with each other so as to define the LC parallel resonator LC3.

The inductor conductive layers 17d, 18d, and 19d and the via-hole conductors v4 and v10 are included in the inductor L4. The capacitor conductive layer 20d and the ground conductive layer 31 are included in the capacitor C4. The inductor L4 and the capacitor C4 are connected in parallel with each other so as to define the LC parallel resonator LC4.

The inductor conductive layers 17e, 18e, and 19e and the via-hole conductors v5 and v11 are included in the inductor L5. The capacitor conductive layer 20e and the ground conductive layer 31 are included in the capacitor C5. The inductor L5 and the capacitor C5 are connected in parallel with each other so as to define the LC parallel resonator LC5.

The inductor conductive layers 17f, 18f, and 19f and the via-hole conductors v6 and v12 are included in the inductor L6. The capacitor conductive layer 20f and the ground conductive layer 31 are included in the capacitor C6. The inductor L6 and the capacitor C6 are connected in parallel with each other so as to define the LC parallel resonator LC6.

The LC parallel resonators LC2 through LC6 preferably have the same or substantially the same structure as that of the LC parallel resonator LC1, and a detailed explanation thereof will thus be omitted. The LC parallel resonators LC1 through LC6 are disposed from the left side to the right side of the multilayer body 12 in this order. The capacitor conductive layers 20a and 20f are respectively extended to the left and right short sides of the insulating layer 16j, so that the LC parallel resonators LC1 and LC6 are connected to the outer electrodes 14a and 14b, respectively. The inductors L2 through L6 have a same winding direction as the inductor L1, as viewed from the left side.

As shown in FIG. 3B, the LC parallel resonators LC1 through LC6 having the structure described above respectively form loop planes S1 through S6 which are surrounded by the inductors L1 through L6 and the capacitors C1 through C6, respectively, and which are parallel or substantially parallel with the top-bottom direction. In the first preferred embodiment, the loop planes S1 through S6 are planes perpendicular or substantially perpendicular to the right-left direction. The loop planes S1 through S6 are planes passing through the centers of the inductor conductive layers 17a through 17f, respectively, in the right-left direction.

Among the loop planes S1 through S6, loop planes adjacent to each other in the right-left direction are superposed on each other, as viewed from the left side. In the first preferred embodiment, the loop planes S1 through S6 are superposed on each other such that they coincide or sub-stantially coincide with each other, as viewed from the left side. With this configuration, among the LC parallel resonators LC1 through LC6, LC parallel resonators adjacent to each other in the right-left direction are magnetically coupled with each other, so that the LC parallel resonators LC1 through LC6 define a band pass filter. In the first preferred embodiment, the loop planes S1 through S6 are superposed on each other such that they substantially coincide with each other. However, there may be a case in which the loop planes S1 through S6 have different heights, in which case, the loop planes S1 through S6 are not superposed on each other such that they coincide or substantially coincide with each other.

As shown in FIG. 3B, among the distances in the right-left direction between adjacent inductor conductive layers among the inductor conductive layers 17a through 17f, the distance between the inductor conductive layers 17c and 17d is the smallest. However, it is not always necessary that the distance in the right-left direction between the inductor conductive layers 17c and 17d be the smallest.

The via-hole conductors v20 through v24 pass through the insulating layers 16k and 16l in the top-bottom direction. The top ends of the via-hole conductors v20 through v24 are connected to the ground conductive layer 31, while the bottom ends of the via-hole conductors v20 through v24 are connected to the outer electrode 14c. With this configuration, the LC parallel resonators LC1 through LC4 are connected to the outer electrode 14c.

The capacitor conductive layer 22 preferably is a strip-shaped conductive layer disposed on the top surface of the insulating layer 16e and extending in the right-left direction. The capacitor conductive layer 22 passes through the loop planes S1 through S6, and overlaps the inductor conductive layers 19a and 19f, as viewed from above. With this configuration, the capacitor Cg is provided between the inductor conductive layers 19a and 19f via the capacitor conductive layer 22.

The capacitor conductive layers 40a and 40c are rectangular or substantially rectangular conductive layers disposed on the top surface of the insulating layer 16f. The capacitor conductive layers 41a and 41c are rectangular or substantially rectangular conductive layers disposed on the top surface of the insulating layer 16h. The capacitor conductive layers 40a and 41a are connected to the via-hole conductor v1 so as to be connected to the inductor L1. The capacitor conductive layers 40c and 41c are connected to the via-hole conductor v3 so as to be connected to the inductor L3.

The capacitor conductive layer 50a preferably is a strip-shaped conductive layer disposed on the top surface of the insulating layer 16g and extending in the right-left direction in the rear of the via-hole conductors v1 through v3. With this configuration, the capacitor conductive layer 50a overlaps the capacitor conductive layers 40a, 40c, 41a, and 41c, as viewed from above. As a result, the capacitor Cc is provided between the capacitor conductive layers 40a and 41a and the capacitor conductive layers 40c and 41c via the capacitor conductive layer 50a.

The capacitor conductive layer 51a preferably is a strip-shaped conductive layer disposed on the top surface of the insulating layer 16i and extending in the right-left direction in the rear of the via-hole conductors v1 and v3. The capacitor conductive layer 51a is connected to the via-hole conductor v2 so as to be connected to the inductor L2. With this configuration, the capacitor conductive layer 51a overlaps the capacitor conductive layers 20a, 20c, 41a, and 41c, as viewed from above. As a result, the capacitor Ca is provided between the capacitor conductive layers 20a and 41a and the capacitor conductive layer 51a, and the capacitor Cb is provided between the capacitor conductive layers 20c and 41c and the capacitor conductive layer 51a.

The capacitor conductive layers 40d, 40f, 41d, 41f, 50b, and 51b are symmetrical to the capacitor conductive layers 40c, 40a, 41c, 41a, 50a, and 51a with respect to a straight line extending in the front-rear direction passing through the center of the multilayer body 12 in the right-left direction, as viewed from above. With this configuration, the capacitor Cf is provided between the capacitor conductive layers 40d and 41d and the capacitor conductive layers 40f and 41f via the capacitor conductive layer 50b, the capacitor Cd is provided between the capacitor conductive layers 20d and 41d and the capacitor conductive layer 51b, and the capacitor Ce is provided between the capacitor conductive layers 20f and 41f and the capacitor conductive layer 51b. A detailed explanation of the capacitor conductive layers 40d, 40f, 41d, 41f, 50b, and 51b will not be given further.

In the above-described electronic component 10a, it is possible to increase the attenuation of radio-frequency signals in the bands outside of the pass band. More specifically, in the electronic component 10a, six stages of LC parallel resonators LC1 through LC6 are preferably utilized, in contrast to the multilayer band pass filter disclosed in International Publication No. 2007/119356 in which five stages of LC parallel resonators are utilized. In this manner, by providing LC parallel resonators in multiple stages, it is possible to increase the attenuation of radio-frequency signals in the bands outside of the pass band.

Additionally, in the electronic component 10a, the capacitors Cc, Cf, and Cg that couple LC parallel resonators which are not adjacent to each other are located at suitable positions, thus enhancing the attenuation in the vicinity of the pass band. For clarifying the advantages achieved by the electronic component 10a, the inventor of this application conducted the following computer simulations. FIGS. 4 through 8 are respectively equivalent circuit diagrams of electronic components 110a through 110e of comparative examples.

Figure 4:
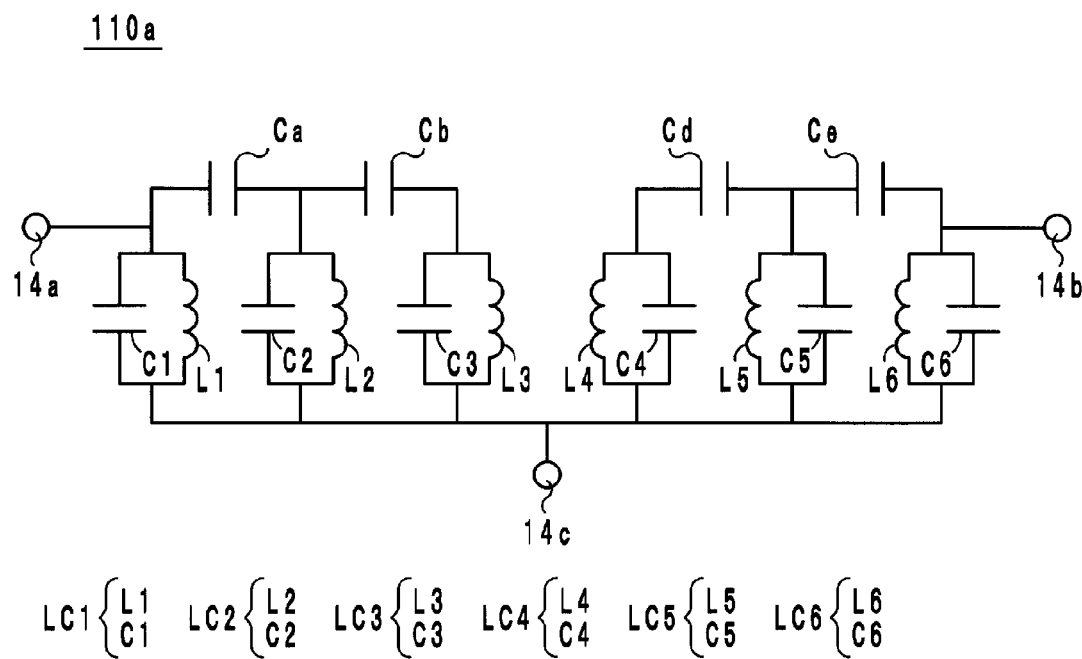
FIGS. 4 through 8 are equivalent circuit diagrams of electronic components of comparative examples.
Figure 5:
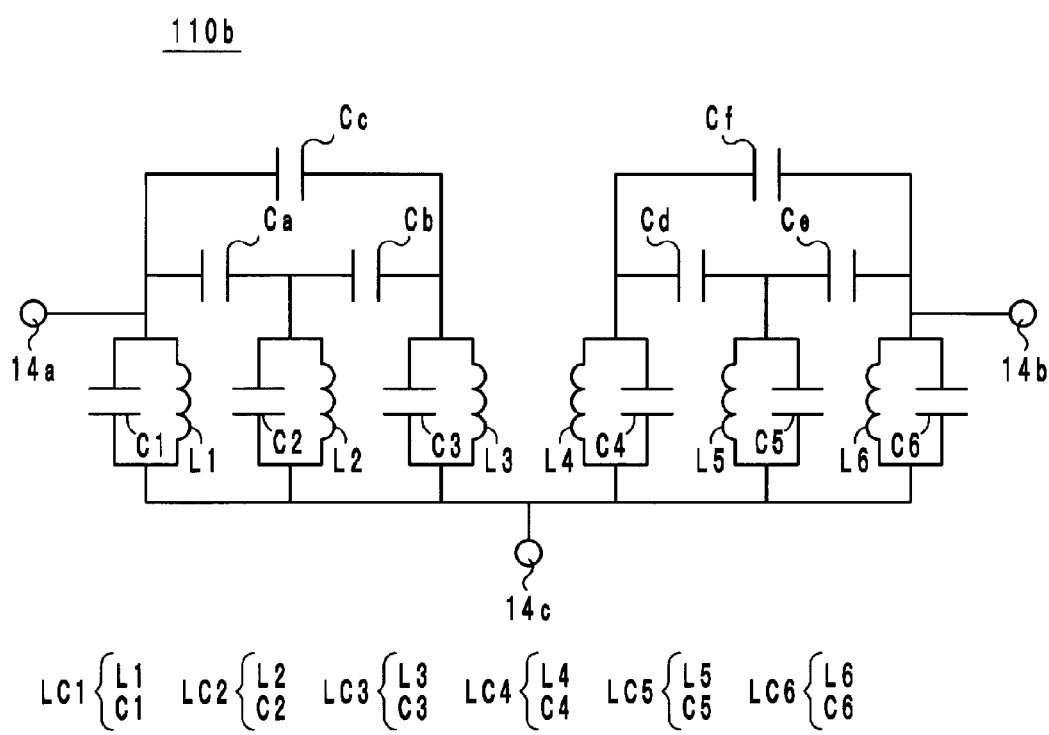
Figure 6:
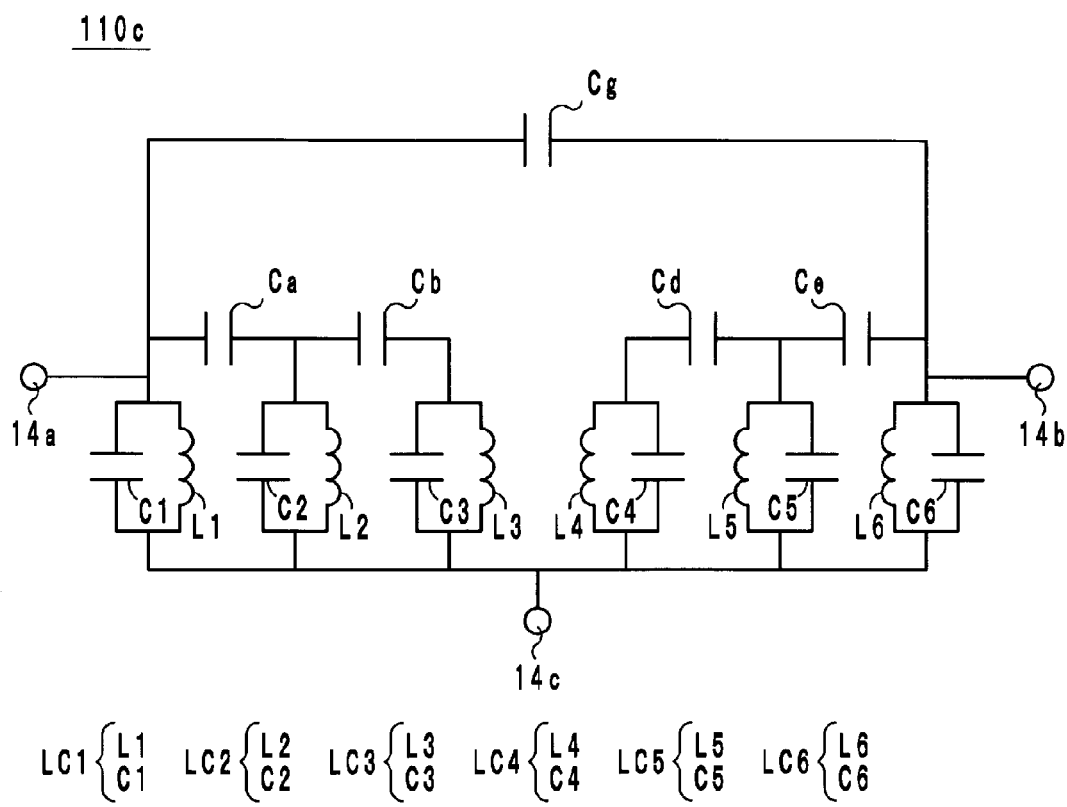
Figure 7:
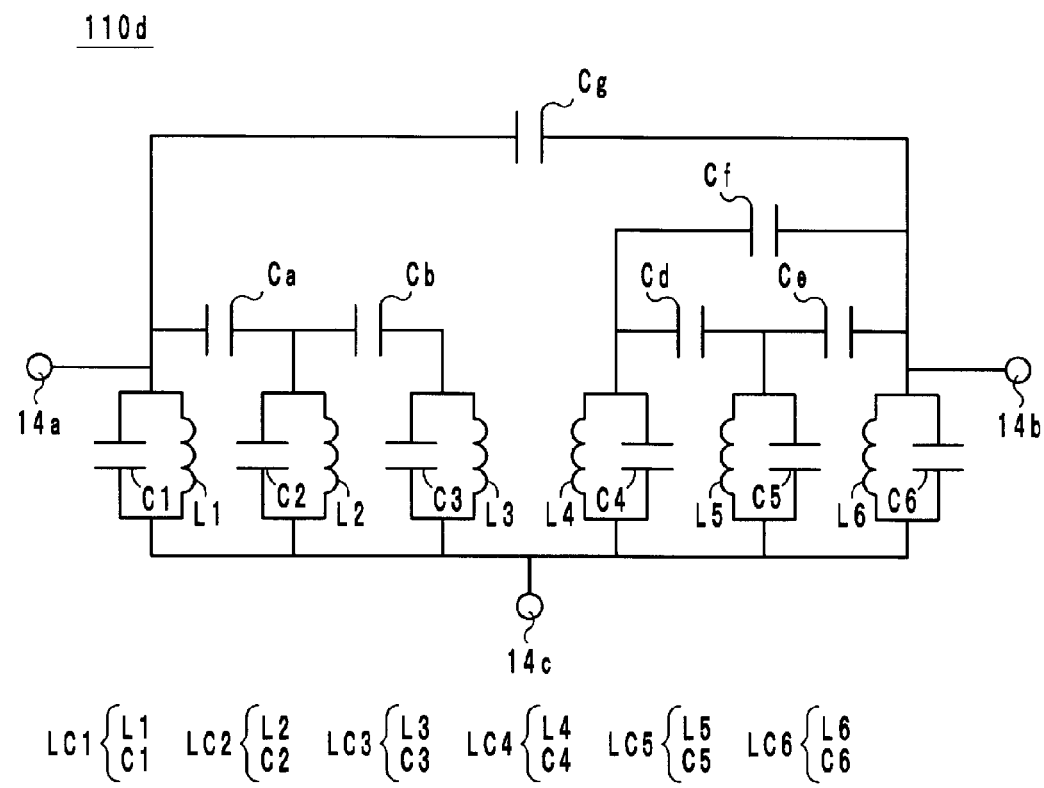
Figure 8:
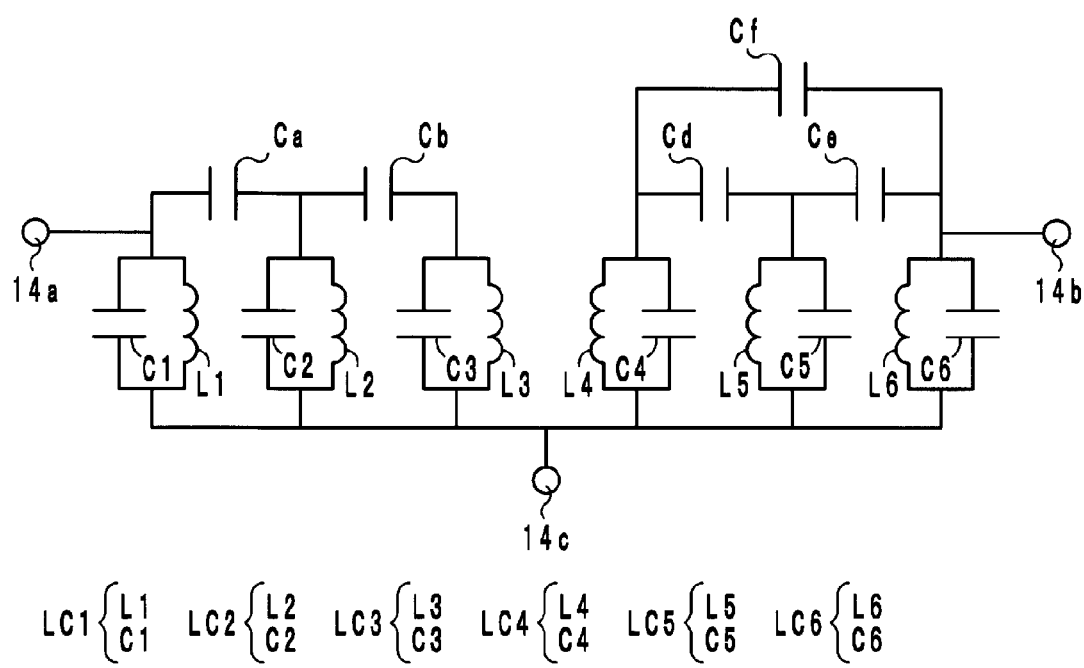

The inventor of this application created models of the electronic components 10a and 110a through 110e and calculated numeric values indicating the bandpass characteristics of these models by using a computer. The circuit configuration of the electronic component 110a shown in FIG. 4 is a configuration in which the capacitors Cc, Cf, and Cg are removed from the electronic component 10a. The circuit configuration of the electronic component 110b shown in FIG. 5 is a configuration in which the capacitor Cg is removed from the electronic component 10a. The circuit configuration of the electronic component 110c shown in FIG. 6 is a circuit configuration in which the capacitors Cc and Cf are removed from the electronic component 10a. The circuit configuration of the electronic component 110d shown in FIG. 7 is a circuit configuration in which the capacitor Cc is removed from the electronic component 10a. The circuit configuration of the electronic component 110e shown in FIG. 8 is a circuit configuration in which the capacitors Cc and Cg are removed from the electronic component 10a.

Figure 9:
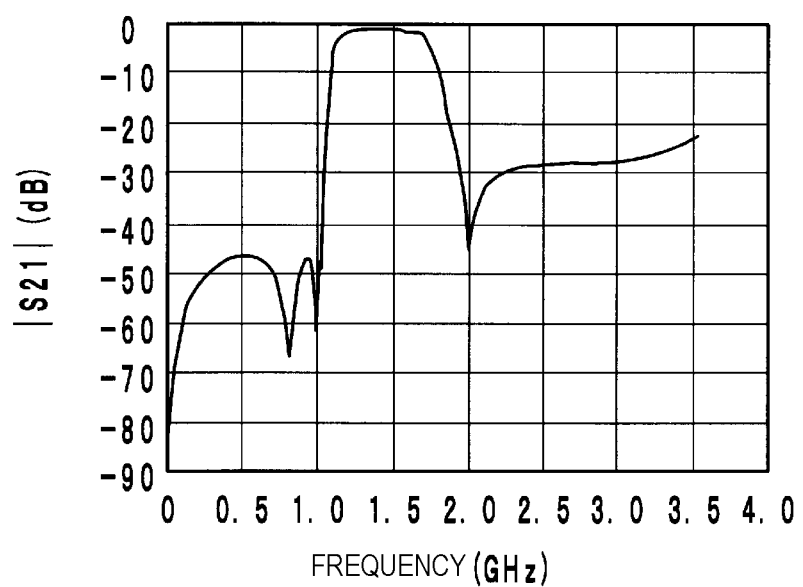
FIG. 9 is a graph illustrating the bandpass characteristic (|S21|) of the electronic component according to the first preferred embodiment of the present invention.
Figure 10:
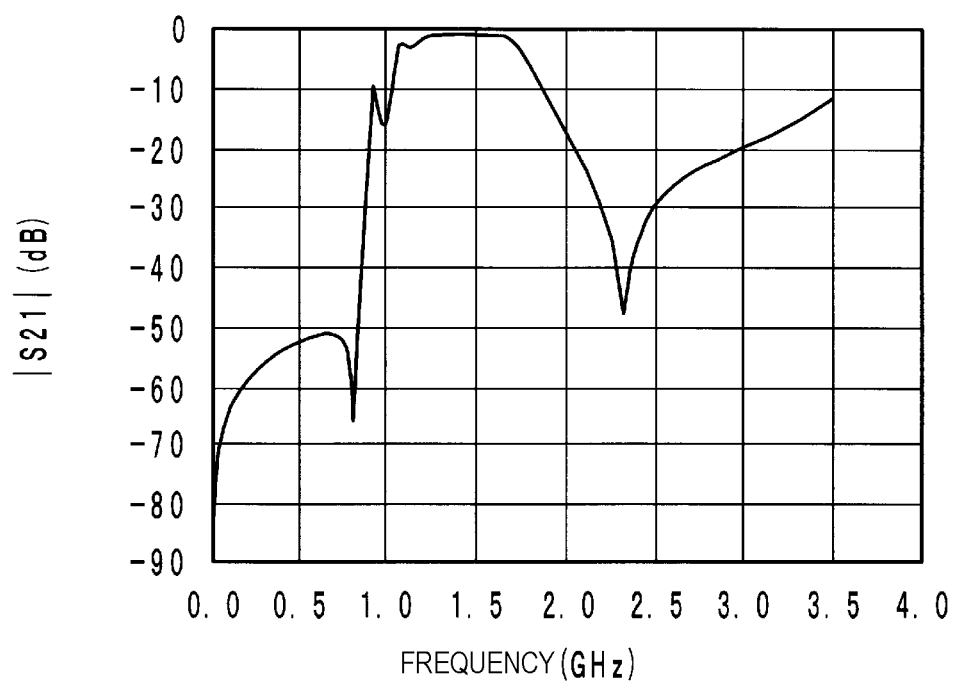
FIGS. 10 through 14 are graphs illustrating the bandpass characteristics (|S21|) of the electronic components of the comparative examples.
Figure 11:
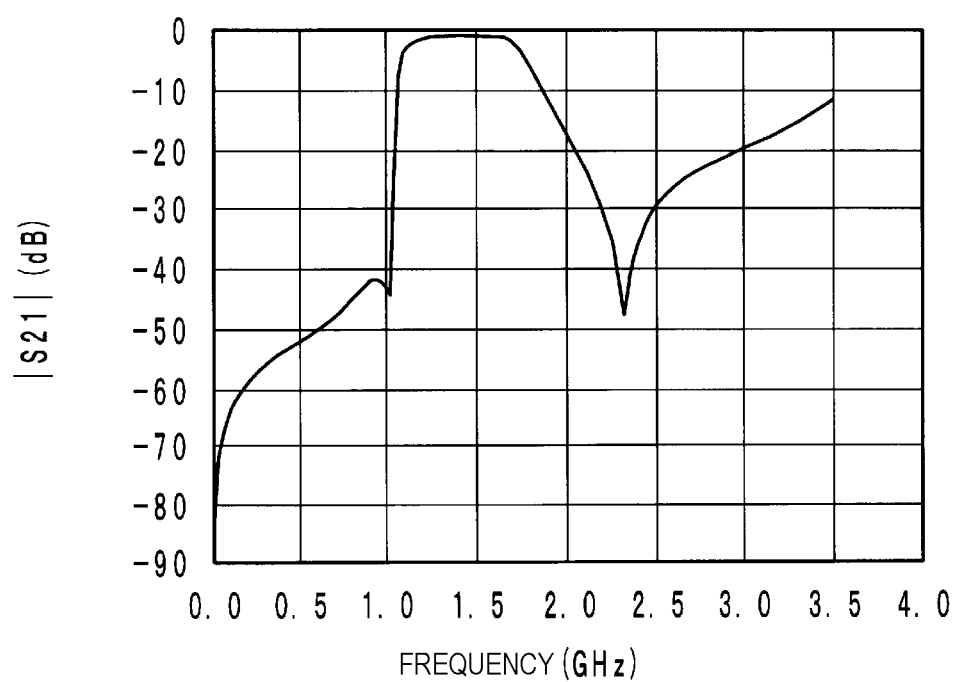
Figure 12:
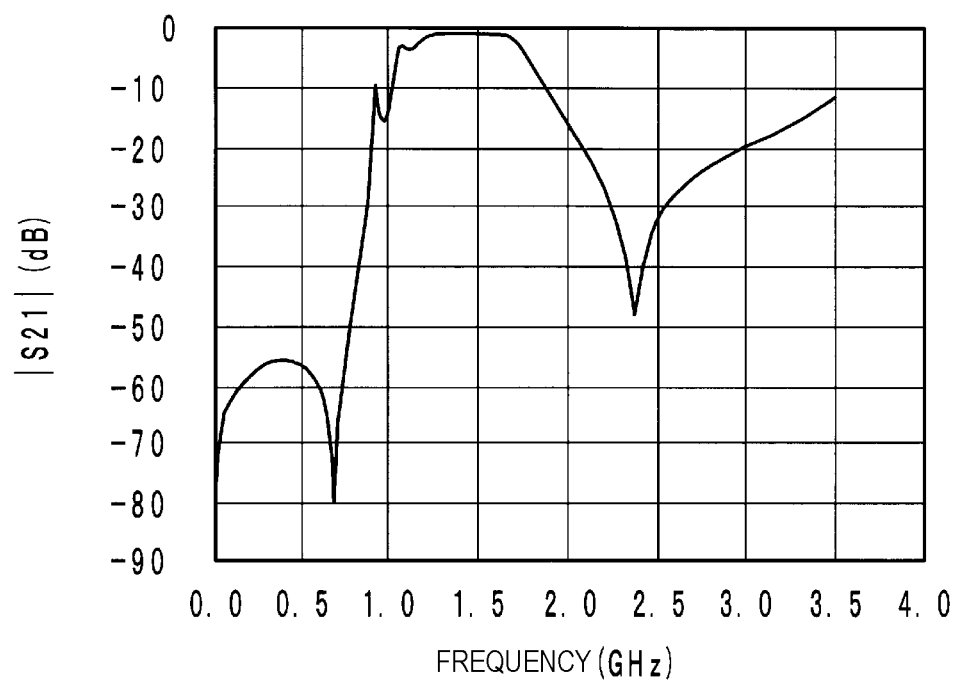
Figure 13:
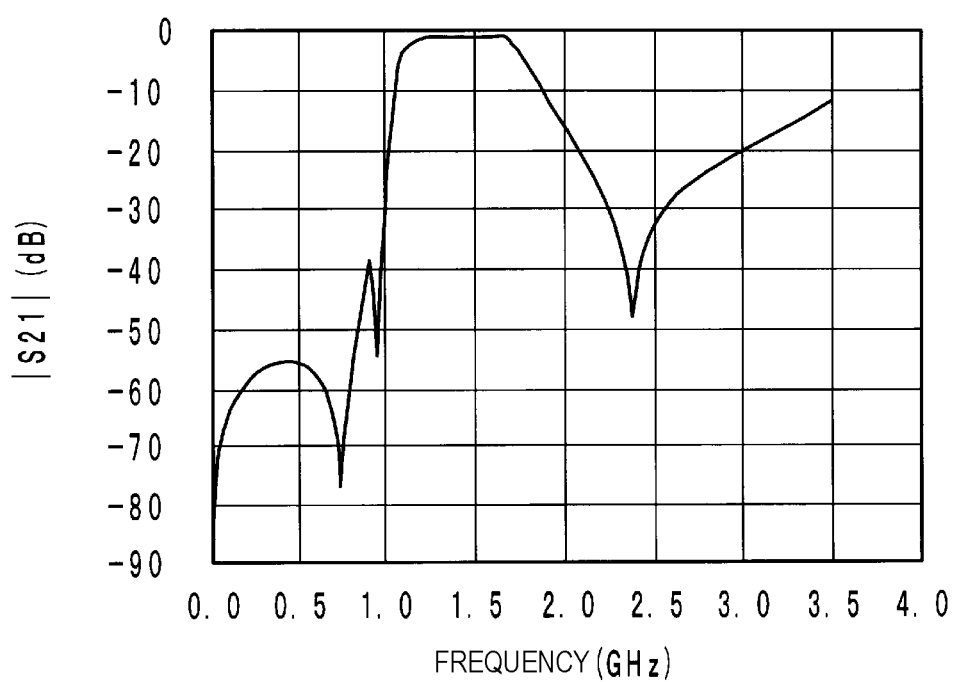
Figure 14:
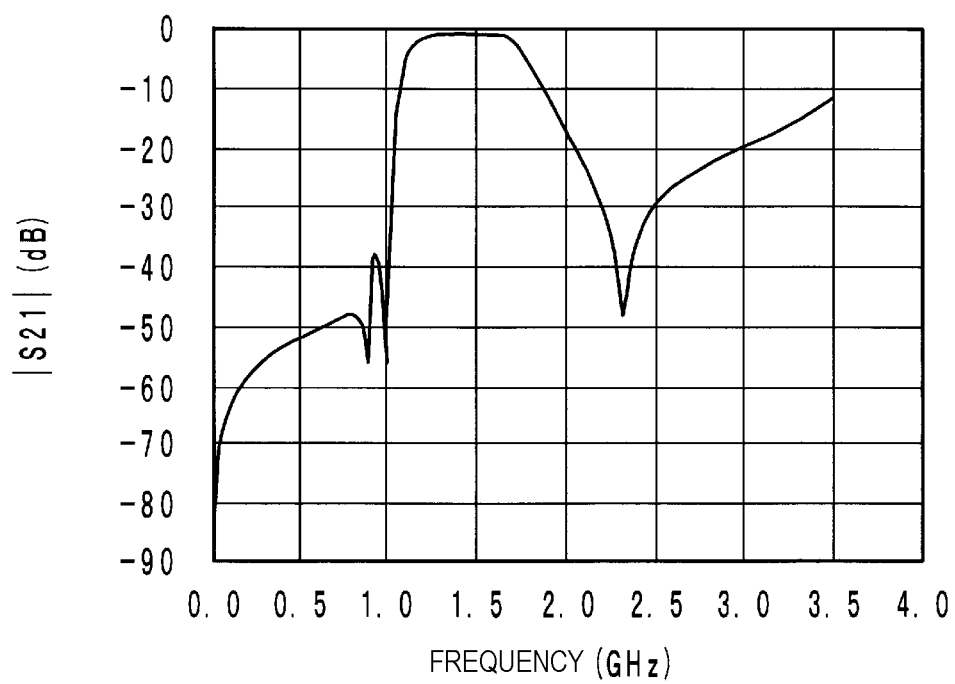

FIG. 9 is a graph illustrating the bandpass characteristic (|S21|) of the electronic component 10a. FIGS. 10 through 14 are graphs illustrating the bandpass characteristics (|S21|) of the electronic components 110a through 110e, respectively. In FIGS. 9 through 14, the vertical axis indicates |S21|, while the horizontal axis indicates the frequency.

FIGS. 10 through 14 show that, in the electronic components 110a through 110e, the attenuation pole in the low frequency side of the pass band is positioned near about 1 GHz, while the attenuation pole in the high frequency side of the pass band is positioned near about 2.3 GHz, for example.

On the other hand, FIG. 9 shows that, in the electronic component 10a, the attenuation pole in the low frequency side of the pass band is positioned near about 1 GHz, while the attenuation pole in the high frequency side of the pass band is positioned near about 2 GHz, for example.

The above-described results show that, in the electronic components 110a through 110e in which at least one of the capacitors Cc, Cf, and Cg is not provided, it is difficult to achieve a narrower pass band. The above-described results also show that, in the electronic component 10a including all the capacitors Cc, Cf, and Cg, it is possible to enhance the attenuation in the vicinity of the pass band. That is, in the electronic component 10a, by locating the capacitors Cc, Cf, and Cg that couple LC parallel resonators which are not adjacent to each other at suitable positions, it is possible to enhance the attenuation in the vicinity of the pass band.

Second Preferred Embodiment

Figure 15:
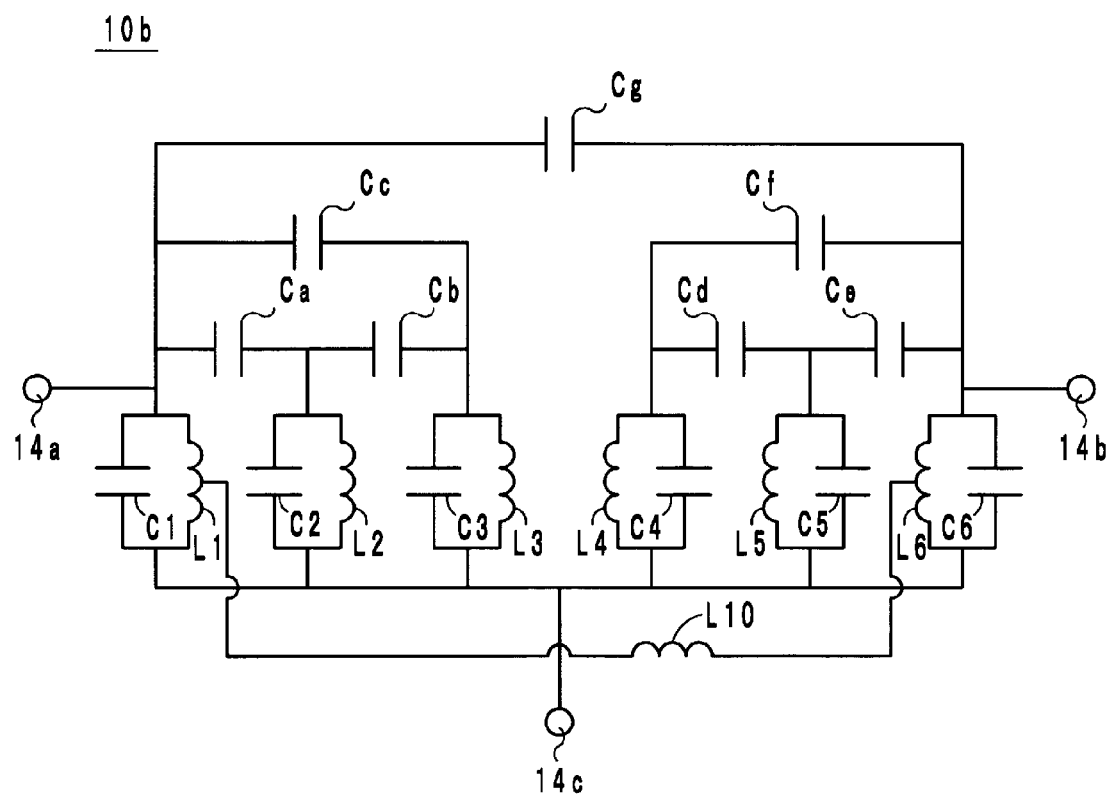
FIG. 15 is an equivalent circuit diagram of an electronic component according to the second preferred embodiment of the present invention.
Figure 16:
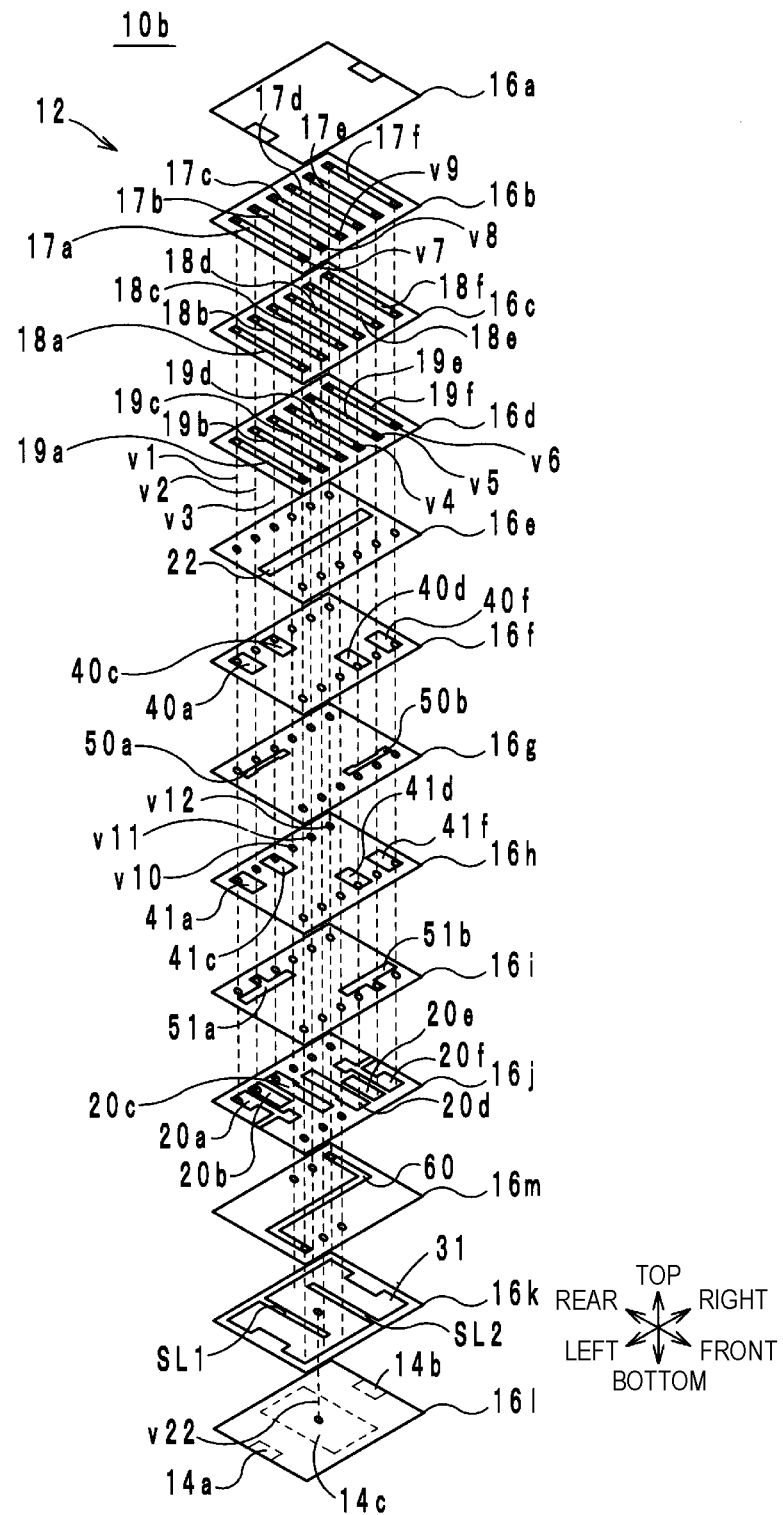
FIG. 16 is an exploded perspective view of the electronic component according to the second preferred embodiment of the present invention.
Figure 17:
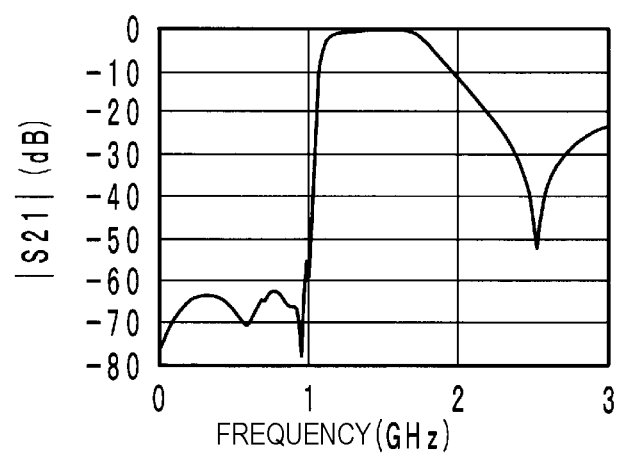
FIG. 17 is a graph illustrating the bandpass characteristic (|S21|) of the electronic component according to the second preferred embodiment of the present invention.

An electronic component 10b according to a second preferred embodiment of the present invention will be described below with reference to the accompanying drawings. FIG. 15 is an equivalent circuit diagram of the electronic component 10b according to the second preferred embodiment. FIG. 16 is an exploded perspective view of the electronic component 10b. FIG. 17 is a graph illustrating the bandpass characteristic (|S21|) of the electronic component 10b. The external perspective view of the electronic component 10b is preferably the same as that of the electronic component 10a, and thus, FIG. 2 is used for explaining the electronic component 10b.

The electronic component 10b is different from the electronic component 10a in the following first through fourth points. The first point is that, as shown in FIG. 16, the structure of the LC parallel resonators LC1 through LC3 of the electronic component 10b is equal to a structure in which the LC parallel resonators LC1 through LC3 of the electronic component 10a are inverted in the front-rear direction. The second point is that the electronic component 10b includes an inductor L10, as shown in FIG. 15. The third point is that slits SL1 and SL2 are provided in the ground conductive layer 31. The fourth point is that, among the inductor conductive layers 17a through 17f, the distances in the right-left direction between adjacent inductor conductive layers are all equal.

The first point will be discussed below in detail. The LC parallel resonators LC1 through LC3 of the electronic component 10b and those of the electronic component 10a are inverted in the front-rear direction. Accordingly, in the electronic component 10b, the via-hole conductors v7 through v9 are located farther frontward than the via-hole conductors v1 through v3. As a result, the turning direction of the inductors L1 through L3 and that of the inductors L4 through L6 are opposite. That is, the inductors L1 through L3 turn around clockwise in a direction from the capacitor conductive layers 20a through 20c to the ground conductive layer 31, as viewed from the left side. In contrast, the inductors L4 through L6 turn around counterclockwise in a direction from the capacitor conductive layers 20d through 20f to the ground conductive layer 31, as viewed from the left side.

The second point will be discussed below in detail. The inductor L10 is connected between the inductors L1 and L6 and is preferably defined by a connecting conductive layer 60. The connecting conductive layer 60 is a linear conductive layer disposed on the top surface of the insulating layer 16m added between the insulating layers 16j and 16k. The connecting conductive layer 60 connects the via-hole conductors v7 and v12.

The third point will be discussed below in detail. The slits SL1 and SL2 are cutouts extending from the outer edges of the ground conductive layer 31 toward the inward direction. In the second preferred embodiment, the slit SL1 is located farther leftward than the center of the ground conductive layer 31 and extends from the rear side of the ground conductive layer toward the front side. The slit SL2 is located farther rightward than the center of the ground conductive layer 31 and extends from the front side of the ground conductive layer 31 toward the rear side. By the provision of the slits SL1 and SL2, the inductance value of the ground conductive layer 31 is increased.

The electronic component 10b having the structure described above achieves the same advantages as those of the electronic component 10a.

In the electronic component 10b, the inductors L1 through L3 and the inductors L4 through L6 have opposite winding directions. Thus, the degree of magnetic coupling between the inductors L1 through L3 and the inductors L4 through L6 is decreased. This makes it more difficult to transmit a radio-frequency signal between the LC parallel resonators LC1 through LC3 and the LC parallel resonators LC4 through LC6. As a result, as indicated by the bandpass characteristic of the electric component 10b shown in FIG. 17, the attenuation in the band lower than the pass band is increased.

Because of the provision of the inductor L10 which connects the inductors L1 and L6 with each other, it is possible to provide an attenuation pole in the low frequency side of the pass band.

There is another reason why the attenuation in the band lower than the pass band is increased in the electronic component 10b. Because of the provision of the slits SL1 and SL2 in the ground conductive layer 31, the inductance value of the ground conductive layer 31 is increased. Then, the degree of magnetic coupling between the LC parallel resonators LC1 through LC6 is changed, so that the position of the attenuation pole in the low frequency side of the pass band is able to be adjusted. As a result, the attenuation in the low frequency side of the pass band is increased.

Third Preferred Embodiment

Figure 18:
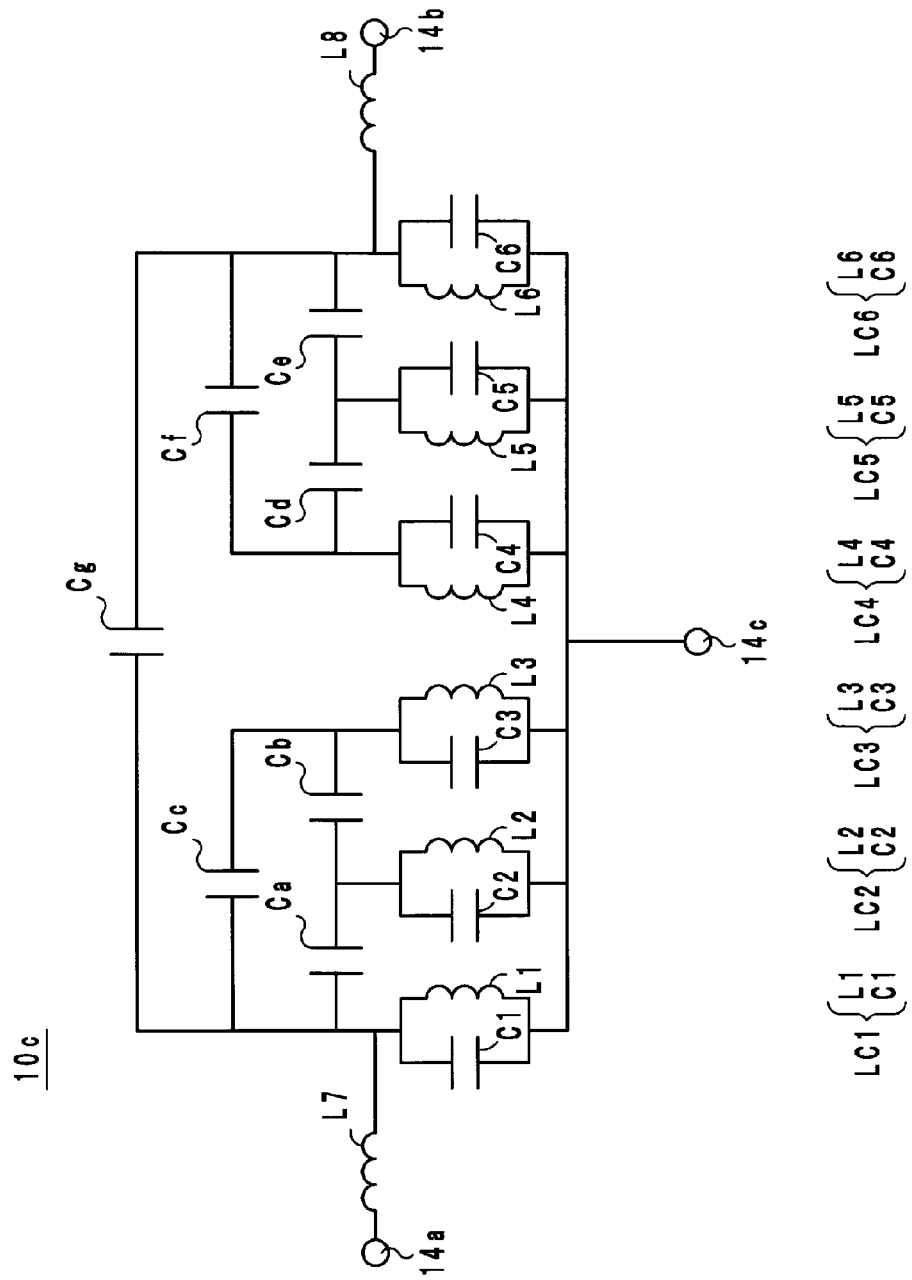
FIG. 18 is an equivalent circuit diagram of an electronic component according to the third preferred embodiment of the present invention.
Figure 19:
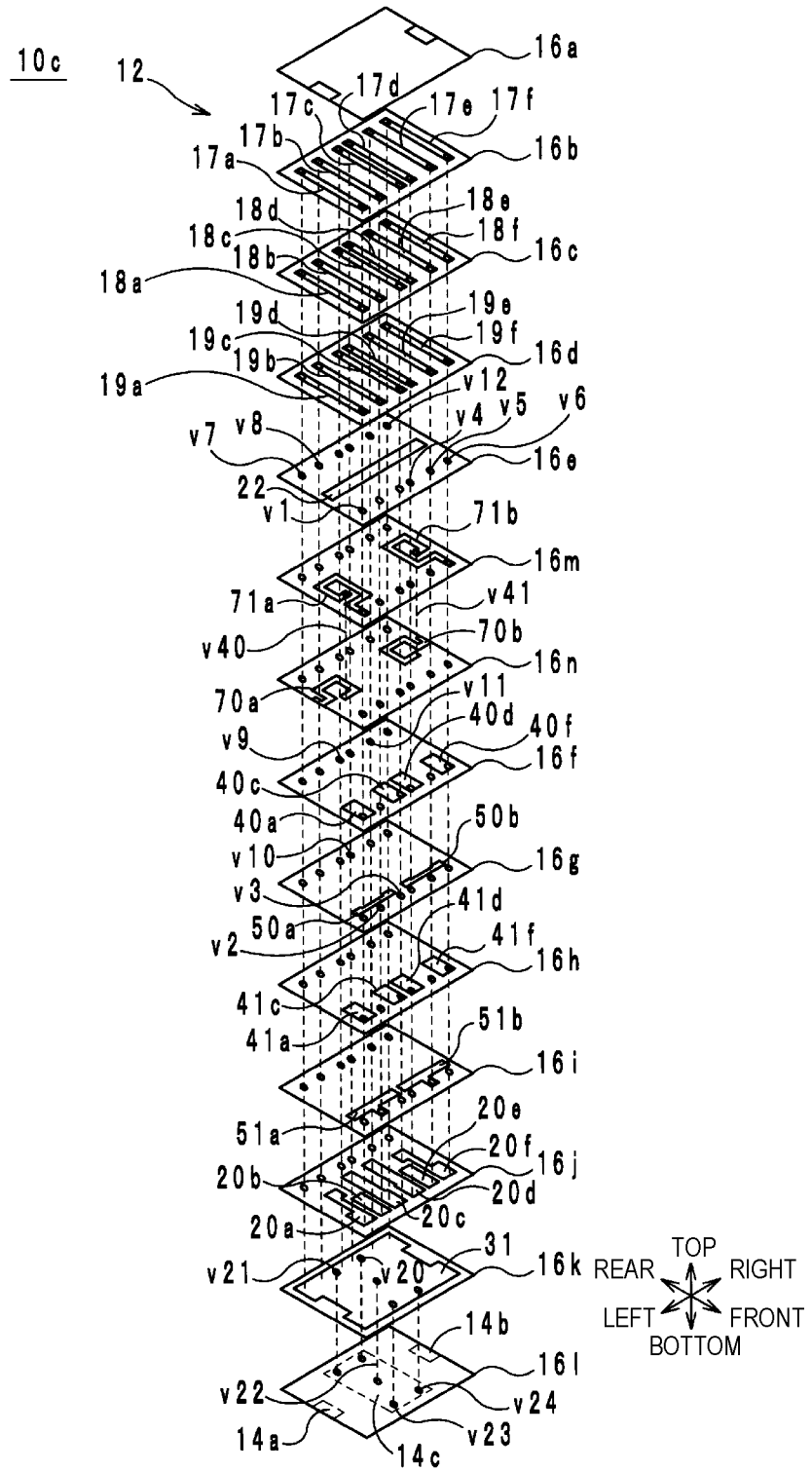
FIG. 19 is an exploded perspective view of the electronic component according to the third preferred embodiment of the present invention.
Figure 20:
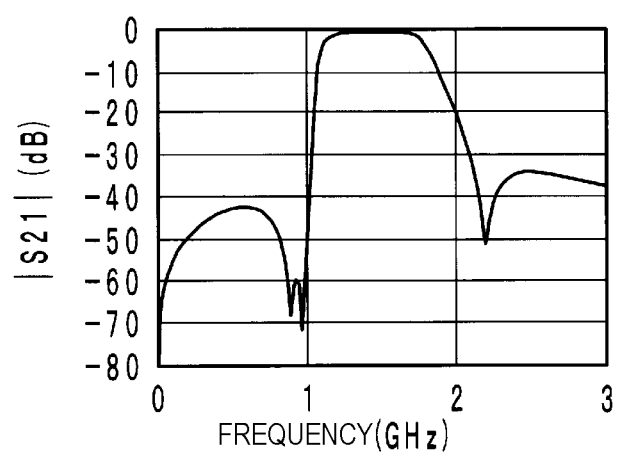
FIG. 20 is a graph illustrating the bandpass characteristic (|S21|) of the electronic component according to the third preferred embodiment of the present invention.

An electronic component 10c according to a third preferred embodiment of the present invention will be described below with reference to the accompanying drawings. FIG. 18 is an equivalent circuit diagram of the electronic component 10c according to the third preferred embodiment. FIG. 19 is an exploded perspective view of the electronic component 10c. FIG. 20 is a graph illustrating the bandpass characteristic (|S21|) of the electronic component 10c. The external perspective view of the electronic component 10c is the same as that of the electronic component 10a, and thus, FIG. 2 is used for explaining the electronic component 10c.

As shown in FIG. 18, the electronic component 10c is different from the electronic component 10a in that inductors L7 and L8 are provided. The inductor L7 is connected between the outer electrode 14a and one end of the LC parallel resonator LC1. The inductor L8 is connected between the outer electrode 14b and one end of the LC parallel resonator LC6. The electronic component 10c will be discussed below by mainly referring to this point.

As shown in FIG. 19, insulating layers 16m and 16n are added between the insulating layers 16e and 16f. The inductor L7 includes inductor conductive layers 70a and 71a and a via-hole conductor v40. The inductor conductive layer 70a is a linear conductive layer disposed on the top surface of the insulating layer 16n and turning around clockwise, as viewed from above. The upstream end portion of the inductor conductive layer 70a in the clockwise direction is extended to the left side of the insulating layer 16n. With this configuration, the inductor L7 is connected to the outer electrode 14a.

The inductor conductive layer 71a is a linear conductive layer disposed on the top surface of the insulating layer 16m and turning around clockwise, as viewed from above. The downstream end portion of the inductor conductive layer 71a in the clockwise direction is connected to the via-hole conductor v1. With this configuration, the inductor L7 is connected to the LC parallel resonator LC1.

The via-hole conductor v40 passes through the insulating layer 16m in the top-bottom direction, and connects the downstream end portion of the inductor conductive layer 70a in the clockwise direction and the upstream end portion of the inductor conductive layer 71a in the clockwise direction.

The inductor L8 includes inductor conductive layers 70b and 71b and a via-hole conductor v41. The inductor L8 is symmetrical to the inductor L7 with respect to a straight line extending in the front-rear direction passing through the center of the multilayer body 12 in the right-left direction, as viewed from above. Accordingly, a detailed explanation of the inductor L8 will be omitted.

The electronic component 10c having the structure described above achieves the same advantages as those of the electronic component 10a.

In the electronic component 10c, the inductors L7 and L8 define and function as low pass filters between the outer electrodes 14a and 14b. As a result, as shown in FIG. 20, the attenuation in the band higher than the pass band is increased.

Other Preferred Embodiments

An electronic component according to a preferred embodiment of the invention is not restricted to the above-described electronic components 10a through 10c, and it may be modified within the scope of the present invention. The configurations of the electronic components 10a through 10c may be combined in a desired manner.

It is not always necessary that the loop planes S1 through S6 be parallel with each other.

Preferred embodiments of the present invention may be suitably used as an electronic component since it is possible to increase the attenuation of radio-frequency signals in the bands outside of a pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a multilayer body including a plurality of insulating layers stacked on each other in a stacking direction;

first through sixth LC parallel resonators that are arranged in a first direction perpendicular or substantially perpendicular to the stacking direction in order of the first through sixth LC parallel resonators and that define a band pass filter;

a seventh capacitor directly connected to the first and sixth LC parallel resonators;

an eighth capacitor directly connected to the first and third LC parallel resonators; and a ninth capacitor directly connected to the fourth and sixth LC parallel resonators; wherein the n-th LC parallel resonator includes an n-th inductor and an n-th capacitor, where n is an integer of 1 to 6;

an n-th loop plane which is surrounded by the n-th inductor and the n-th capacitor and which is parallel or substantially parallel with the stacking direction is provided; and among the first through sixth loop planes, loop planes adjacent to each other in the first direction are superposed on each other, as viewed from the first direction.

2. The electronic component according to claim 1, wherein the n-th inductor includes n-th and (n+6)-th interlayer connecting conductors which pass through some of the plurality of insulating layers in the stacking direction and an n-th inductor conductive layer disposed on an insulating layer of the plurality of insulating layers; and the n-th and (n+6)-th interlayer connecting conductors extend from the n-th inductor conductive layer toward one side of the stacking direction.

3. The electronic component according to claim 2, wherein the n-th capacitor includes an n-th capacitor conductive layer and a ground conductive layer which oppose each other with an insulating layer of the plurality of insulating layers interposed therebetween;

the n-th interlayer connecting conductor is connected to the n-th capacitor conductive layer; and the (n+6)-th interlayer connecting conductor is connected to the ground conductive layer.

4. The electronic component according to claim 3, wherein the seventh through ninth interlayer connecting conductors are located farther toward one side of a second direction which is perpendicular or substantially perpendicular to the stacking direction and the first direction than the first through third interlayer connecting conductors; and the tenth through twelfth interlayer connecting conductors are located farther toward the other side of the second direction than the fourth through sixth interlayer connecting conductors.

5. The electronic component according to claim 3, wherein the ground conductive layer includes a slit extending from an outer edge of the ground conductive layer toward an inward direction.

6. The electronic component according to claim 2, wherein the first through sixth inductor conductive layers extend in a second direction which is perpendicular or substantially perpendicular to the stacking direction and the first direction; and among distances in the first direction between the m-th inductor conductive layers and the (m+1)-th inductor conductive layers, the distance in the first direction between the third and fourth inductor conductive layers is smallest, where m is an integer of 1 to 5.

7. The electronic component according to claim 2, further comprising a connecting conductive layer that connects the first and sixth inductors with each other.

8. The electronic component according to claim 2, wherein each of the interlayer connecting conductors is a via hole.

9. The electronic component according to claim 2, wherein the first through sixth loop planes pass through respective centers of the first through sixth inductor conductive layers in a right-left direction.

10. The electronic component according to claim 1, further comprising:
a first outer electrode; and
a seventh inductor connected between the first outer electrode and the first LC parallel resonator.

11. The electronic component according to claim 1, wherein the nth inductor has an angular U-shape opened downward.

12. The electronic component according to claim 1, wherein the first through sixth loop planes are perpendicular or substantially perpendicular to a right-left direction.

13. The electronic component according to claim 1, wherein adjacent pairs of the first through sixth LC parallel resonators are magnetically coupled with each other.

14. The electronic component according to claim 1, wherein a winding direction of a first group of the first through sixth inductors is opposite to a winding direction of a second group of the first through sixth inductors.

15. The electronic component according to claim 1, further comprising first and second outer electrodes, a seventh inductor connected between the first outer electrode and one of the first through sixth LC parallel resonators, and an eighth inductor connected between the second outer electrode and another one of the first through sixth LC parallel resonators.

16. The electronic component according to claim 1, further comprising first and second outer electrodes, and first and second low pass filters connected to the bandpass filter between the first and second outer electrodes.

* * * * *